United States Patent
Iyer et al.

(10) Patent No.: US 6,688,584 B2
(45) Date of Patent: Feb. 10, 2004

(54) COMPOUND STRUCTURE FOR REDUCED CONTACT RESISTANCE

(75) Inventors: Ravi Iyer, Boise, ID (US); Yongjun Jeff Hu, Boise, ID (US); Luan Tran, Meridian, ID (US); Brent Gilgen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 30 days.

(21) Appl. No.: 09/858,617

(22) Filed: May 16, 2001

(65) Prior Publication Data

US 2002/0171146 A1 Nov. 21, 2002

(51) Int. Cl.⁷ ............................................. H01L 29/40
(52) U.S. Cl. ...................................... 258/750; 258/751
(58) Field of Search ............................. 257/750, 751, 257/763, 764, 768

(56) References Cited

U.S. PATENT DOCUMENTS

| | | | |
|---|---|---|---|
| 4,816,424 A | * | 3/1989 | Watanabe et al. ............ 437/190 |
| 5,049,975 A | * | 9/1991 | Ajika et al. ..................... 357/71 |
| 5,633,200 A | | 5/1997 | Hu |
| 5,654,235 A | * | 8/1997 | Matsumoto et al. ........ 438/643 |
| 5,847,463 A | | 12/1998 | Trivedi et al. |
| 6,002,174 A | | 12/1999 | Akram et al. |
| 6,080,665 A | | 6/2000 | Chen et al. |
| 6,081,034 A | | 6/2000 | Sandhu et al. |
| 6,093,615 A | | 7/2000 | Schuele et al. |
| 6,100,185 A | | 8/2000 | Hu |
| 6,121,134 A | | 9/2000 | Burton et al. |
| 6,147,405 A | | 11/2000 | Hu |
| 6,475,907 B1 | * | 11/2002 | Taguwa ....................... 438/648 |

\* cited by examiner

*Primary Examiner*—Roy Potter

(57) ABSTRACT

Various embodiments of the invention described herein reduce contact resistance to a silicon-containing material using a first refractory metal material overlying the silicon-containing material and a second refractory metal material overlying the first refractory metal material. Each refractory metal material is a conductive material containing a refractory metal and an impurity. The first refractory metal material is a metal-rich material, containing a level of its impurity at less than a stoichiometric level. The second refractory metal material has a lower affinity for the impurities than does the first refractory metal material. The second refractory metal material can thus serve as an impurity donor during an anneal or other exposure to heat. This net migration of the impurities to the first refractory metal material limits growth of a metal silicide interface between the first refractory metal material and the underlying silicon-containing material, thereby providing ohmic contact with attendant thermal tolerance.

88 Claims, 7 Drawing Sheets

COMPOUND STRUCTURE FOR REDUCED CONTACT RESISTANCE

TECHNICAL FIELD OF THE INVENTION

The present invention relates generally to reducing contact resistance in integrated circuits, and in particular to the development of compound structures and processes for reducing contact resistance with attendant thermal tolerance, as well as integrated circuit devices utilizing such structures and processes.

BACKGROUND OF THE INVENTION

Electronic information handling or computer systems, whether large machines, microcomputers or small and simple digital processing devices, require memory for storing data and program instructions. Various memory systems have been developed over the years to address the evolving needs of information handling systems. One such memory system includes semiconductor memory devices.

Computer, communication and industrial applications are driving the demand for memory devices in a variety of electronic systems. One important form of semiconductor memory device includes Dynamic Random Access Memory (DRAM). A typical DRAM includes an array of memory cells. Each memory cell includes a capacitor that stores the data in the cell and a transistor that controls access to the data. The charge stored across the capacitor is representative of a data bit.

Data can be either stored in the memory cells during a write mode, or data may be retrieved from the memory cells during a read mode. The data is transmitted on signal lines, referred to as bit lines, which are coupled to input/output (I/O) lines through transistors used as switching devices. Typically, for each bit of data stored, its true logic state is available on an I/O line and its complementary logic state is available on an I/O complement line.

The memory cells are typically arranged in an array and each cell has an address identifying its location in the array. The array includes a configuration of intersecting conductive lines and memory cells are associated with the intersections of the lines. In order to read from or write to a cell, the particular cell in question must be selected, or addressed. The address for the selected cell is represented by input signals to an address decoder. In response to the decoded address, row access circuitry activates a word line. The selected word line activates the access transistors for each of the memory cells in communication with the selected word line. In response to the decoded column address, column access circuitry selects a bit line. For a read operation, the selected word line activates the access transistors for a given word line address, and data is latched to the selected bit line.

Designers are under constant pressure to increase memory cell density to reduce costs and increase performance. As memory cell density is increased, memory cell size is generally decreased. As memory cell size decreases, contact resistance becomes more critical as the cross-sectional area for current flow decreases. As an example, a metal-containing bit line may make contact to a source/drain region of an access transistor through a polysilicon contact plug. To improve contact resistance between the bit line and the contact plug, a titanium silicide interface is often formed for good ohmic contact between the metal of the bit line and the polysilicon of the contact plug. However, this titanium silicide interface is susceptible to agglomeration if the device is exposed to high temperatures. Such high temperatures are routine in semiconductor processing such as Rapid Thermal Processing (RTP). The risk of agglomeration increases as the thickness of the silicide layer increases. Agglomeration of the titanium silicide or other refractory metal silicide can cause delamination of the bit line, resulting in increased contact resistance.

For the reasons stated above, and for other reasons stated below that will become apparent to those skilled in the art upon reading and understanding the present specification, there is a need in the art for alternative structures and processes for improving contact resistance in integrated circuit devices.

SUMMARY

Various embodiments of the invention described herein reduce contact resistance to a silicon-containing material using a first refractory metal material overlying the silicon-containing material and a second refractory metal material overlying the first refractory metal material. Each refractory metal material is a conductive material containing a refractory metal and an impurity capable of forming a chemical bond with the refractory metal. The first refractory metal material is a metal-rich material, containing a level of its impurity at less than a stoichiometric amount. The second refractory metal material has a lower affinity for the impurities than does the first refractory metal material. As such, the second refractory metal material can serve as an impurity donor during an anneal or other exposure to heat. This net migration of the impurities from the second refractory metal material to the first refractory metal material limits growth of a metal silicide interface between the first refractory metal material and the underlying silicon-containing material, thereby providing ohmic contact with attendant thermal tolerance.

A variety of impurities can be used to form chemical bonds with refractory metals to produce a conductive material. Examples include boron (B), carbon (C), nitrogen ($N_2$) and oxygen ($O_2$). Each refractory metal material can use the same or different impurities. The choice of impurity is dependent upon the choice of refractory metals as some impurities may form dielectric materials when reacted with the refractory metal. For example a titanium dioxide material is generally considered to have dielectric properties while a tungsten dioxide material is generally considered to have conductive properties.

One class of embodiments uses nitrogen as the impurity for both the first and second refractory metal materials. Such embodiment include a first refractory metal nitride layer overlying a silicon-containing material and a second refractory metal nitride layer overlying the first refractory metal nitride layer. The first refractory metal nitride layer is an unsaturated or metal-rich nitride material. The first refractory metal nitride layer preferably has a bulk resistivity near its unsaturated maximum bulk resistivity. The second refractory metal nitride layer has a lower affinity for nitrogen than the unsaturated first refractory metal nitride layer. In this manner, the first refractory metal nitride layer can accept nitrogen from the second refractory metal nitride layer during an anneal or other exposure to heat. The migration of nitrogen from the second refractory metal nitride layer to the first refractory metal nitride layer limits growth of a metal silicide interface between the first refractory metal nitride layer and the underlying silicon-containing material, thereby providing ohmic contact with attendant thermal tolerance.

For one embodiment, the invention provides a compound structure for reduced contact resistance to a silicon-containing material. The compound structure includes a first refractory metal material overlying the silicon-containing material, wherein the first refractory metal material contains a first refractory metal and a first impurity. The first impurity is capable of forming a chemical bond with the first refractory metal and is contained in the first refractory metal material at a level less than a stoichiometric level. The compound structure further includes a second refractory metal material overlying the first refractory metal material. The second refractory metal material contains a second refractory metal and a second impurity capable of forming a chemical bond with the second refractory metal. The second refractory metal material has a lower affinity for the impurities than does the first refractory metal material.

For another embodiment, the invention provides a compound structure for reduced contact resistance to a silicon-containing material. The compound structure includes a first refractory metal nitride layer overlying the silicon-containing material, wherein the first refractory metal nitride layer is an unsaturated refractory metal nitride material. The compound structure further includes a second refractory metal nitride layer overlying the first refractory metal nitride layer, wherein the second refractory metal nitride layer has a lower affinity for nitrogen than the first refractory metal nitride layer.

For yet another embodiment, the invention provides a compound structure for reduced contact resistance to a silicon-containing material. The compound structure includes a titanium nitride layer overlying the silicon-containing material, wherein the titanium nitride layer is formed by reactive sputtering from a titanium target in a nitrogen-containing ambient to produce an unsaturated titanium nitride material having a bulk resistivity within 15% of a maximum unsaturated bulk resistivity. The compound structure further includes a refractory metal nitride layer overlying the titanium nitride layer. For a further embodiment, the refractory metal nitride layer is a saturated refractory metal nitride material. For a still further embodiment, the refractory metal nitride layer has a lower affinity for nitrogen than the titanium nitride layer.

For still another embodiment, the invention provides a compound structure for reduced contact resistance to a silicon-containing material. The compound structure includes a titanium nitride layer overlying the silicon-containing material, wherein the titanium nitride layer is formed by reactive sputtering from a titanium target in a nitrogen-containing ambient to produce an unsaturated titanium nitride material of the form $TiN_x$ where x is in the range of approximately 0.2 to approximately 0.8. The compound structure further includes a refractory metal nitride layer overlying the titanium nitride layer. For a further embodiment, the refractory metal nitride layer is a saturated refractory metal nitride material. For a still further embodiment, the refractory metal nitride layer has a lower affinity for nitrogen than the titanium nitride layer.

For a further embodiment, the invention provides a bit-line contact. The bit-line contact includes a titanium nitride layer adjoining a silicon-containing material, wherein the titanium nitride layer is formed by a physical vapor deposition process to be an unsaturated titanium nitride material and to have a bulk resistivity within 15% of a maximum unsaturated bulk resistivity. The bit-line contact further includes a tungsten nitride layer overlying the titanium nitride layer.

For a still further embodiment, the invention provides a word line for a memory cell. The word line include a gate dielectric layer, a gate polysilicon layer overlying the gate dielectric layer, an unsaturated titanium nitride layer overlying the gate polysilicon layer, a tungsten nitride layer overlying the titanium nitride layer, and a gate conductor layer overlying the tungsten nitride layer. For one embodiment, the tungsten nitride layer has a lower affinity for nitrogen than the unsaturated titanium nitride layer. For another embodiment, the unsaturated titanium nitride layer has a bulk resistivity within 15% of its unsaturated maximum bulk resistivity.

For one embodiment, the invention provides a memory cell. The memory cell includes a gate stack overlying a silicon substrate and a first source/drain region and a second source/drain region in the silicon substrate on opposing sides of the gate stack. The memory cell further includes a capacitor having a bottom plate, a top plate and a dielectric layer interposed between the bottom plate and the top plate. The memory cell still further includes a titanium nitride layer adjoining a silicon-containing material, wherein the titanium nitride layer is formed by reactive sputtering from a titanium target in a nitrogen-containing ambient to produce an unsaturated titanium nitride material having a bulk resistivity within 15% of a maximum unsaturated bulk resistivity. The silicon-containing material may be either the first source/drain region or a silicon-containing contact plug adjoining the first source/drain region. The memory cell still further includes a refractory metal nitride layer overlying the titanium nitride layer, wherein the refractory metal nitride layer is coupled to the bottom plate of the capacitor.

For another embodiment, the invention provides a method of reducing contact resistance to a silicon-containing material. The method includes forming a first refractory metal nitride layer on the silicon-containing material, wherein the first refractory metal nitride layer is an unsaturated refractory metal nitride material. The method further includes forming a second refractory metal nitride layer on the first refractory metal nitride layer, wherein the second refractory metal nitride layer has a lower affinity for nitrogen than the first refractory metal nitride layer. The method still further includes annealing to form a refractory metal silicide interface between the first refractory metal nitride layer and the silicon-containing material.

For yet another embodiment, the invention provides a method of reducing contact resistance to a silicon-containing material. The method includes forming an unsaturated titanium nitride layer on the silicon-containing material using an ionized metal plasma process in a nitrogen-containing ambient. The method further includes forming a tungsten nitride layer on the titanium nitride layer. The method still further includes annealing to form a refractory metal silicide interface between the titanium nitride layer and the silicon-containing material.

Further embodiments of the invention include compound structures and methods of varying scope, as well as apparatus and systems making use of such compound structures and methods.

DETAILED DESCRIPTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and the terms wafer and substrate include the underlying layers containing such regions/junctions. The following detailed description is, therefore, not to be taken in a limiting sense, and the scope of the present invention is defined only by the appended claims and equivalents thereof.

Figure 1:
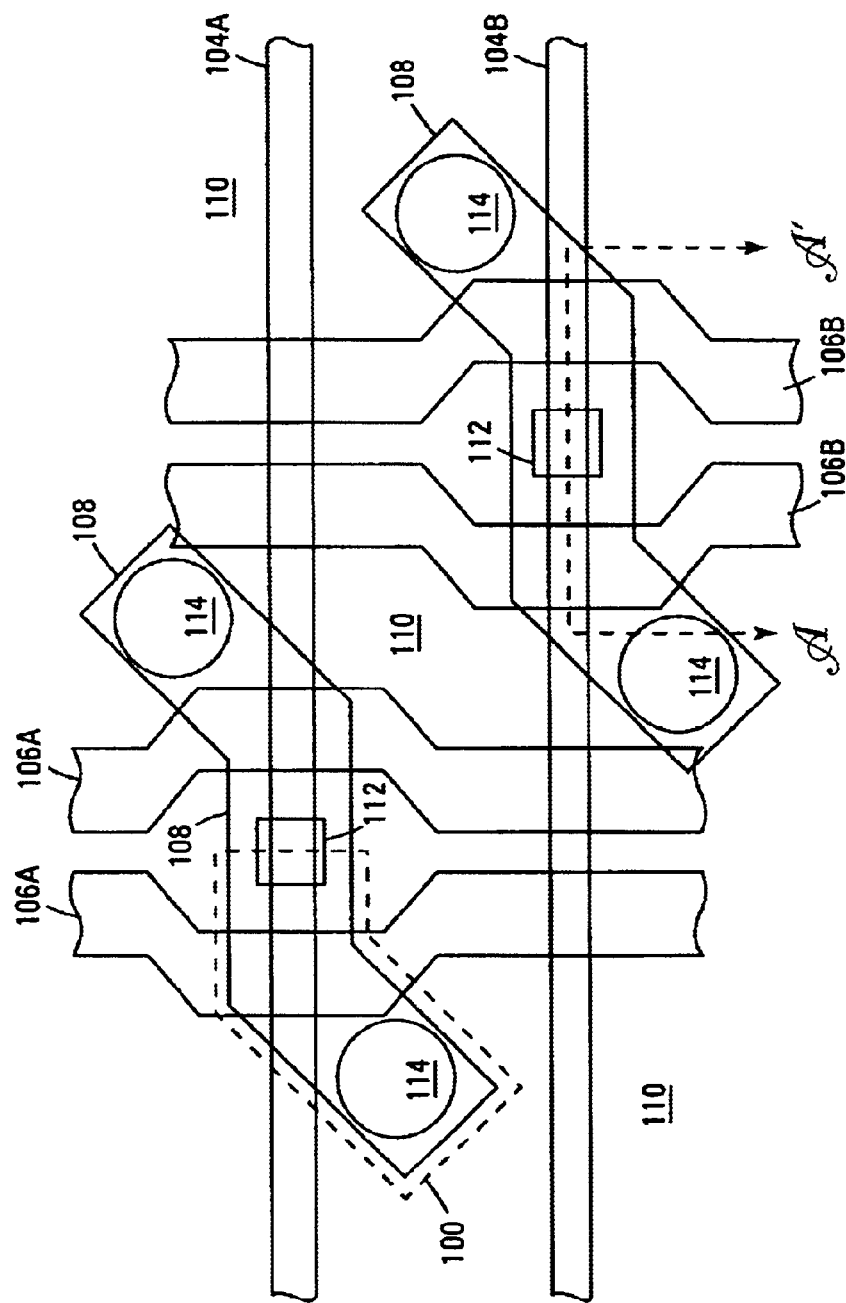
FIG. 1 is a top view of a memory array layout in accordance with an embodiment of the invention.

FIG. 1 is a top view of a memory array layout in accordance with an embodiment of the invention. The memory array includes memory cells 100 formed overlying active areas 108. Active areas 108 are separated by field isolation regions 110. Active areas 108 and field isolation regions 110 are formed on a substrate.

Each memory cell 100 includes a capacitor 114 and an access transistor. The capacitor 114 is typically a container capacitor or other three-dimensional structure for increased capacitance values in a given die area. The access transistor is defined by a word line 106 and has a first source/drain region associated with the capacitor 114 and a second source/drain region associated with a bit-line contact 112. For one embodiment, the bit-line contact 112 includes a compound structure in accordance with the invention. For another embodiment, a compound structure in accordance with the invention is coupled between the active area 108 and the bottom plate of the capacitor 114. For yet another embodiment, the word lines 106A and 106B include a compound structure in accordance with the invention.

The memory cells 100 are arranged substantially in rows and columns. Shown in FIG. 1 are portions of two bit lines 104A and 104B. Bit line 104A couples to an active area 108 through a bit-line contact 112 associated with word line 106A. Bit line 104B couples to an active area 108 through a bit-line contact 112 associated with word line 106B. The capacitors 114 are generally offset laterally from the bit lines 104A and 104B to allow the bit lines 104A and 104B to be formed in an insulating layer close to the surface of the substrate, generally known as a buried digit line architecture. Memory cells 100 associated with a single bit line 104 make up a column of memory cells 100. Memory cells 100 associated with a single word line 106 make up a row of memory cells 100.

FIGS. 2A–2D depict fabrication of a portion of the memory array of FIG. 1 in accordance with one embodiment of the invention. FIGS. 2A–2D are cross-sectional views taken along line A–A' of FIG. 1 during various processing stages. Note that the capacitors 114 are not shown in FIGS. 2A–2D as they occur outside the plane of the drawing. Similarly, field isolation regions separating active areas 108 are not shown as they also appear outside the plane of the drawing.

Figure 2A:
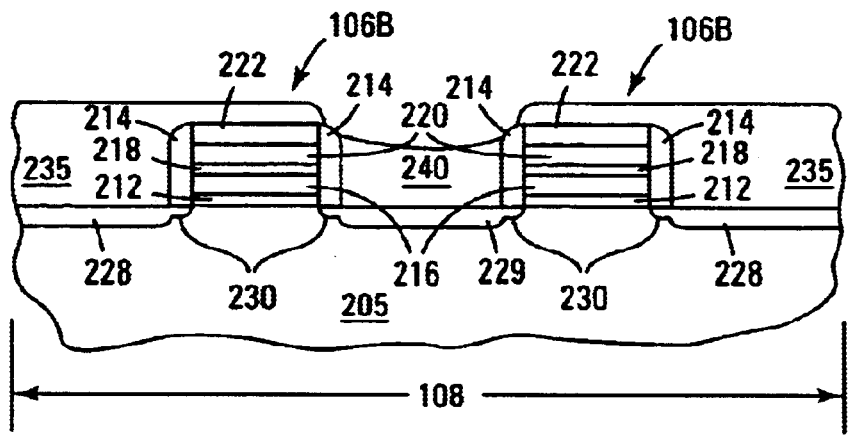
FIGS. 2A–2D are cross-sectional views of a substrate during various stages of fabrication of a portion of the memory array in accordance with an embodiment of the invention.

FIG. 2A depicts word lines 106B on an active area 108 of substrate 205. Substrate 205 may contain a monocrystalline silicon layer or other semiconductor layer. The active areas 108 are those portions of the substrate 205 not covered by a field isolation region 110. The word lines 106B include a gate dielectric layer 212. For one embodiment, the gate dielectric layer 212 includes a thermally-grown silicon dioxide ($SiO_2$), but may be other dielectric materials described herein or known in the art. Typical dielectric materials include silicon oxides ($SiO/SiO_2$), silicon nitrides ($SiN/Si_2N/Si_3N_4$) and silicon oxynitrides ($SiO_xN_y$).

Following the formation of the gate dielectric layer 212, a first conductively-doped gate polysilicon layer 216, a gate barrier layer 218, a gate conductor layer 220, a gate cap layer 222 and gate spacers 214 are formed by methods well known in the art. Gate barrier layer 218 may be a refractory metal nitride, such as titanium nitride (TiN) or tungsten nitride ($WN_x$). Gate conductor layer 220 may be any conductive material. For one embodiment, the gate conductor layer includes a metal layer, such as a layer of tungsten (W). Gate cap layer 222 is often silicon nitride while gate spacers 214 are generally of a dielectric material such as silicon oxide, silicon nitride and silicon oxynitride. The foregoing layers are patterned to form the word lines 106B as gates for field-effect transistors (FET) as the access transistors of the memory cells. The construction of the word lines 106B are illustrative only. As a further example, the construction of the word lines 106B may include a refractory metal silicide layer overlying a polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. Other constructions for word lines 106B are well known in the art and generally include a gate stack of one or more conductive layers overlying a gate dielectric layer, with the sidewalls and top of the gate stack insulated with dielectric material.

Source/drain regions 228 and 229 are formed in the substrate 205 such as by conductive doping of the substrate 205. Accordingly, for a monocrystalline silicon substrate, the source/drain regions 228 and 229 are defined by regions of conductively-doped monocrystalline silicon. The active areas 108 include the source/drain regions 228 and 229 as well as the channel regions between the first source/drain regions 228 and the second source/drain region 229.

Source/drain regions 228 and 229 have a conductivity type opposite the substrate 205. For a p-type substrate, source/drain regions 228 and 229 would have an n-type conductivity. Such conductive doping may be accomplished through ion implantation of phosphorus, arsenic or other n-type dopant species for this embodiment. Doping may further be accomplished through diffusion of the dopant species, such as gaseous diffusion or diffusion at an interface of a layer of heavily-doped material and the substrate 205. As is often the case, source/drain regions 228 and 229 include lightly-doped regions 230 created by differential levels of dopant concentration or even differing dopant species. Lightly-doped regions 230 are often formed through angled implantation of the dopant species to extend beneath the word lines 106B and to coincide with or underlap the gate dielectric layer 212. The formation of the word lines 106B as described are exemplary of one application to be used in conjunction with various embodiments of the invention. Other methods of fabrication and other applications are also feasible and perhaps equally viable.

A thick insulating layer 235 is formed overlying substrate 205, as well as word lines 106B, first source/drain regions 228 and second source/drain regions 229. The insulating layer 235 is a dielectric material such as silicon oxide, silicon nitride and silicon oxynitride materials. For one embodiment, the insulating layer 235 is a doped dielectric material such as borophosphosilicate glass (BPSG), a boron and phosphorous-doped silicon oxide material. The insulating layer 235 is generally planarized, such as by chemical-mechanical planarization (CMP), in order to provide a uniform height. The insulating layer 235 is then patterned to define areas for future bit-line contacts. Patterning of the insulating layer 235 exposes the second source/drain region 229 between the word lines 106B.

Patterning of the insulating layer 235 may include standard photolithographic techniques to mask portions of the insulating layer 235 and to expose portions of the insulating layer 235 where future bit-line contacts are to be formed. The exposed portions of the insulating layer 235 are then removed. The portions of the insulating layer 235 may be removed by etching or other suitable removal technique known in the art. Removal techniques are generally dependent upon the material of construction of the layer to be removed as well as the surrounding or underlying layers to be retained.

Following patterning of the insulating layer 235, a layer of conductively-doped polysilicon or other conductive material is formed overlying exposed portions of the second source/drain region 229 to form a contact plug 240. As one example, contact plug 240 may be formed by controlled deposition of polysilicon to cover only the exposed second source/drain region 229 and perhaps the surface of the insulating layer 235. Any material deposited on the surface of the insulating layer 235 may be removed such as by CMP. Alternatively, a layer of conductive material may be blanket deposited followed by an etch-back to leave a layer of conductive material overlying the second source/drain region 229. For still further embodiments, contact plug 240 may be formed from other conductively-doped silicon-containing materials. For another embodiment, contact plug 240 is eliminated, i.e., no contact plug 240 is formed.

For clarity and to focus on the formation of the compound contact structures, many of the reference numbers are eliminated from subsequent drawings, particularly those reference numbers pertaining to the structure of the word lines and the source/drain regions.

Figure 2B:
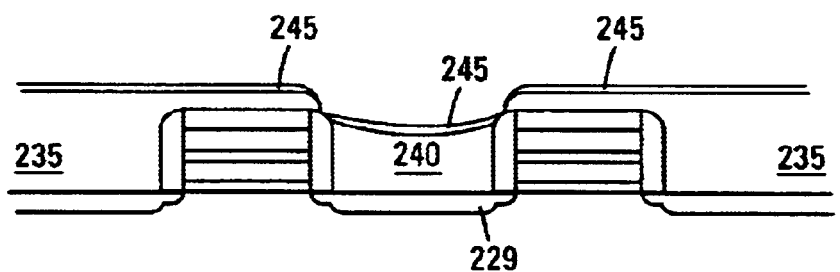
Figure 2C:
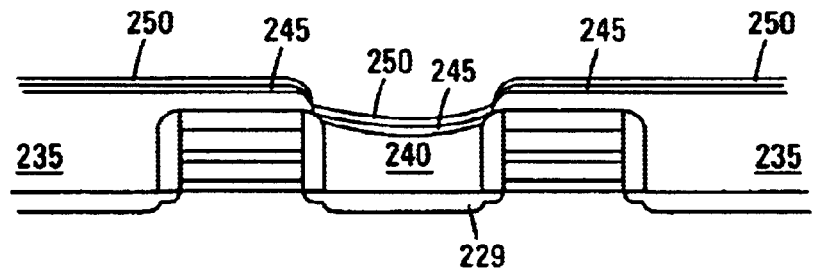

In FIG. 2B, a first refractory metal material 245 is formed overlying at least the contact plug 240. The first refractory metal material is a conductive material containing a first refractory metal and a first impurity capable of forming a chemical bond with the refractory metal. Example impurities include boron (B), carbon (C), nitrogen ($N_2$) and oxygen ($O_2$). The first refractory metal material is an unsaturated or metal-rich material, i.e., the atomic ratio of the impurity to the refractory metal component is less than a stoichiometric level.

For one embodiment, the first impurity is nitrogen such that the first refractory metal material forms a first refractory metal nitride layer. For a further embodiment, the first refractory metal is titanium such that the first refractory metal nitride layer is a titanium nitride ($TiN_x$) layer 245. It is generally desirable to remove any native oxide from silicon-containing surfaces prior to forming the titanium nitride layer 245 or other first refractory metal material. Removal of native oxides may be accomplished through a process of wet dipping in solutions containing hydrofluoric acid (HF), such as aqueous solutions of HF and tetramethylammonium hydroxide (TMAH). Another example includes solutions of phosphoric acid ($H_3PO_4$) and buffered HF. Other etchants or removal techniques are also known in the art.

The first refractory metal nitride layer is an unsaturated or metal-rich nitride, i.e., the atomic ratio of nitrogen to the refractory metal component is less than a stoichiometric level. For titanium, the atomic ratio of nitrogen is thus less than one. The titanium nitride layer 245 should be adjoining a silicon-containing portion of the contact plug 240. As one example, the titanium nitride layer 245 may be formed on a conductively-doped polysilicon contact plug 240. If the contact plug 240 contains multiple layers of conductive materials, at least the uppermost layer should contain silicon with the titanium nitride layer 245 adjoining this silicon-containing layer. For embodiments without a contact plug 240, the titanium nitride layer 245 is formed overlying at least the exposed portion of the second source/drain region 229 and adjoining the second source/drain region 229. Regardless of whether a contact plug 240 is utilized, the titanium nitride layer 245 may also overlie portions of the insulating layer 235. For one embodiment, any titanium nitride layer 245 overlying portions of the insulating layer 235 are removed, such as by CMP.

For one embodiment, the titanium nitride layer 245 or other first refractory metal material is deposited using a physical vapor deposition (PVD) process, preferably a process that is highly directional. Such processes can lead to improved bottom coverage as aspect ratios increase. Improved bottom coverage is generally desirable when the contact plug 240 is recessed or non-existent, thereby providing good coverage of the contact plug 240 or the second source/drain region 229, respectively.

One example of a PVD process is an Ionized Metal Plasma (IMP) process. Ionizing sputtered metal allows for highly directional PVD. One example of an apparatus for performing IMP processing may include an ENDURA® system commercially available from Applied Materials, Santa Clara, Calif., USA. An example of an ENDURA® system is described in U.S. Pat. No. 6,080,665 issued Jun. 27, 2000 to Chen et al.

Apparatus for use in IMP processing generally include a deposition chamber having a pedestal to support a semiconductor substrate to be coated and a target, such as a titanium plate. The pedestal has an RF power bias source, the deposition chamber includes an RF power source, and the target has an RF or a DC power source. Metal particles (atoms, ions, etc.) are sputtered from the target. These metal particles pass through a high-density plasma formed between the target and semiconductor substrate where they become ionized. The ionization of the metal particles enables a user to control the angular distribution of material arriving at the substrate for maximum coverage in the bottom of the contact openings by the manipulation of the electric field at the substrate.

In the deposition chamber, the plasma is maintained by inductively coupling RF energy from the RF power source into the plasma, such as by applying the RF energy to a coil surrounding the plasma. An electric field, or bias voltage, develops in a sheath layer around the plasma, accelerating the metal ions in a vector substantially perpendicular to the semiconductor substrate by electrostatic coupling. The potential difference between the plasma and the semiconductor substrate can be optionally modulated by applying independent bias power from a pedestal power bias source to the semiconductor substrate.

The degree of ionization of sputtered metal particles depends on their residence time in the plasma (i.e., the longer the residence time, the greater the ionization). The sputtered atoms are ejected from the target with relatively high energies (about 1 eV to 10 eV), leading to very short residence times. In order to slow down the metal particles for higher ionization, the process is usually operated at relatively high pressure (greater than about 10 mTorr). Such a pressure regime is higher than the 0.5–10 mTorr normally encountered in traditional PVD processes.

For one embodiment, the PVD process is an IMP process using a titanium target, a bias power of approximately 0–500 W, a coil power of approximately 100–3000 W, a nitrogen ($N_2$) flow rate of approximately 5–25 sccm, an argon (Ar) flow rate of approximately 10–50 sccm, and a deposition time of approximately 3–10 seconds. For a further embodiment, the PVD process is an IMP process using a titanium target, a bias power of approximately 300 W, a coil power of approximately 2800 W, a nitrogen flow rate of approximately 13 sccm, an argon flow rate of approximately 40 sccm, and a deposition time of approximately 6 seconds. For alternate embodiments, the nitrogen flow can be replaced by other impurities, such as oxygen or boron flows, to react these impurities with the refractory metal during deposition.

The first refractory metal material is relatively thin to reduce agglomeration concerns. For one embodiment, the first refractory metal material has a thickness of approximately 20–120 Å. For a further embodiment, the first refractory metal material has a thickness of approximately 50–90 Å. For a still further embodiment, the first refractory metal material has a thickness of approximately 75–90 Å.

The first refractory metal material can be formed by any of a number of techniques. For example, a refractory metal layer can be doped with the impurity after deposition, such as by diffusion or implantation techniques. Preferably, however, the first refractory metal material is the result of a reactive process during formation and most preferably during sputtering, although one of skill in the art can apply chemical vapor deposition (CVD) methods in light of the present disclosure. Additionally, the first refractory metal nitride layer may be a higher-order compound containing more than simply a refractory metal and a single impurity. As one example, the first refractory metal material may be a ternary compound containing metal, nitrogen and silicon. A CVD chemistry of titanium tetrachloride ($TiCl_4$), silane ($SiH_4$) and ammonia ($NH_3$) can be used to produce such a ternary compound.

Figure 3:
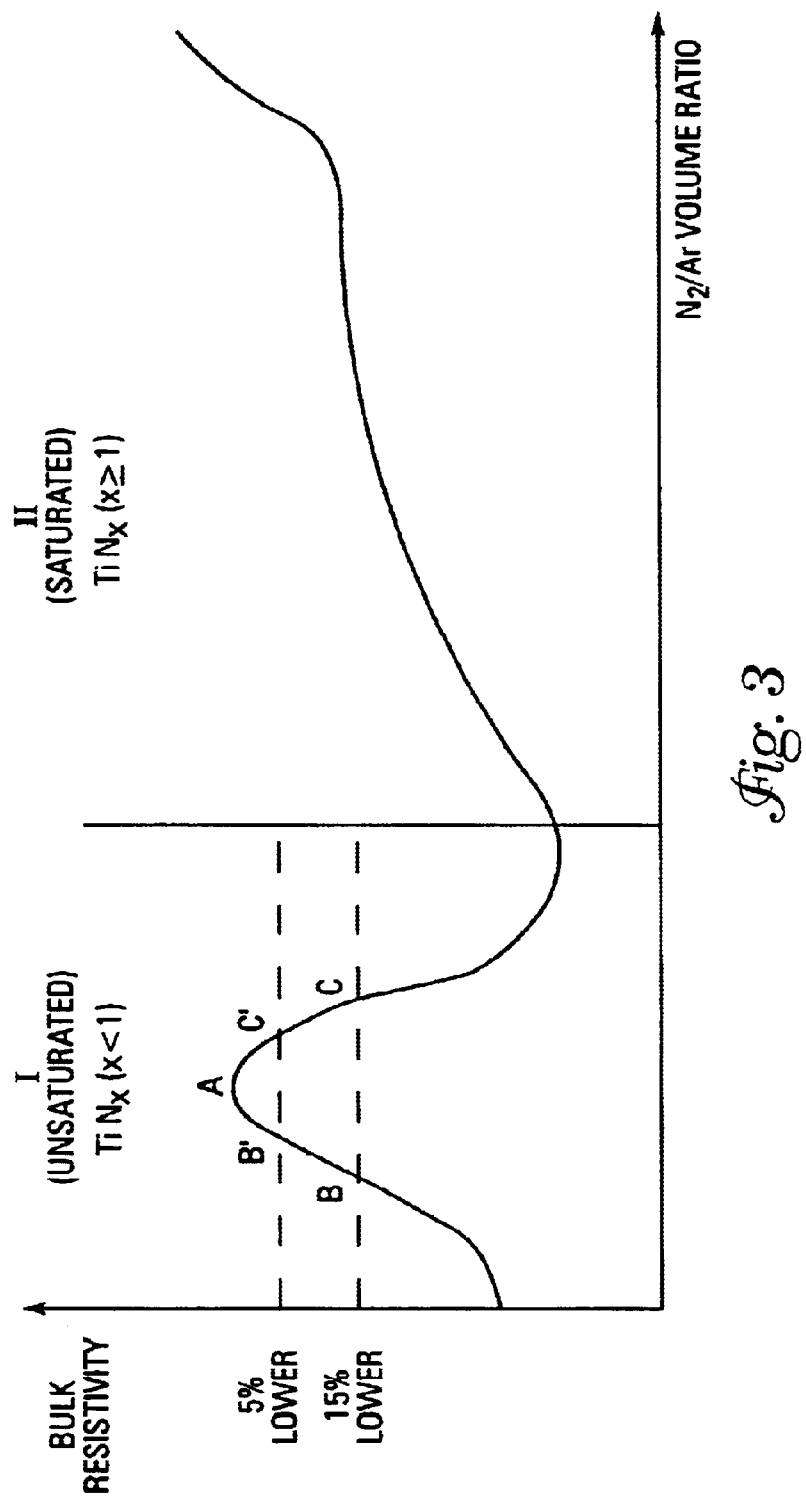
FIG. 3 is a plot of bulk resistivity as it relates to a method for choosing a region of operation in accordance with the invention.

FIG. 3 is a plot of bulk resistivity as it relates to a method for choosing a region of operation in accordance with the invention using nitrogen as the first impurity and titanium as the first refractory metal. In particular, FIG. 3 is a plot of bulk resistivity of a titanium nitride layer resulting from the reactive sputtering of titanium in a nitrogen ($N_2$) and argon (Ar) ambient. Bulk resistivity of the titanium nitride layer is plotted as a function of the $N_2$/Ar volume ratio in the reactive sputtering of titanium to form titanium nitride at a given target power. As FIG. 3 illustrates, reactive sputtering of titanium falls into two main regions or realms. Sputtering with a $N_2$/Ar ratio within Region I results in an unsaturated or titanium-rich titanium nitride of the form $TiN_x$, where x<1. Sputtering within Region II results in a saturated titanium nitride of the form $TiN_x$, where x≧1. The bulk resistivity has a maximum unsaturated value at point A. Point A thus represents the flow ratio for which the highest bulk resistivity titanium-rich $TiN_x$ is achieved, which, in turn, reflects a highly uniform distribution of nitride nuclei throughout the titanium film. Beyond Point A, nuclei begin to grow and eventually contact one another, causing bulk resistivity to drop.

As the nitrogen content is increase, the saturated region or Region II begins wherein no excess titanium is available. Resistivity again rises within this region as excess nitrogen interferes with conductivity. Points B and C represent lower and higher flow ratios, respectively, which result in an unsaturated $TiN_x$ film of about 15% lower bulk resistivity than a film formed at peak A. The inventors have determined that unsaturated refractory metal nitride layers produced having bulk resistivities near the unsaturated maximum provide desirable regulation of silicide formation in the various embodiments. For one embodiment, the first refractory metal nitride layer is an unsaturated titanium nitride layer having a bulk resistivity within 15% of its unsaturated maximum bulk resistivity. For another embodiment, the first refractory metal nitride layer is an unsaturated titanium nitride layer having a bulk resistivity within 5% of its unsaturated maximum bulk resistivity. Points B' and C' represent lower and higher flow ratios, respectively, which result in an unsaturated $TiN_x$ film of about 5% lower bulk resistivity than a film formed at peak A. For a further embodiment, the first refractory metal nitride layer is an unsaturated titanium nitride layer having a bulk resistivity approximately equal to its unsaturated maximum bulk resistivity. The first refractory metal nitride layer should be unsaturated such that it is capable of forming a silicide interface with the underlying silicon-containing material for good ohmic contact. While FIG. 3 is a plot for a nitrogen and argon ambient, other nitrogen-containing ambients can be used with the embodiments of the invention.

Absolute ratios in FIG. 3 depend upon the sputtering power. For example, with 2000 W sputtering power, 35 sccm of argon and 7–8 sccm of nitrogen result in a maximum Region I resistivity of about 270 $\mu\Omega$-cm. The $TiN_x$ resulting from this $N_2$/Ar ratio has x approximately equal to 0.6. Increasing sputtering power gives smaller $TiN_x$ nucleates, and reducing power gives larger $TiN_x$ nucleates. Higher sputtering power thus flattens out the peak A. It will be understood, in light of the present disclosure, that at higher sputtering power, a larger window of preferred $N_2$/Ar ratios is available to achieve an unsaturated bulk resistivity near the maximum. In general, sputtering with a ratio closer to point A results in a better $TiN_x$ distribution uniformity, which in turn results generally in more uniform silicide formation and improved contact resistance. Typically, x is around 0.5 or 0.6 at point A. It can typically range from approximately 0.2 to approximately 0.8 between point B and point C, and from approximately 0.4 to approximately 0.7 between point B' and point C', when higher or lower sputtering power is used. The maximum unsaturated bulk resistivity is dependent upon the process used to produce the titanium nitride material and should thus be read in context of the process used.

Returning to FIG. 2C, a second refractory metal material 250 is formed overlying at least the first refractory metal material 245 overlying the contact plug 240. The second refractory metal material is a conductive material containing a second refractory metal and a second impurity capable of forming a chemical bond with the second refractory metal. Example impurities include boron (B), carbon (C), nitrogen ($N_2$) and oxygen ($O_2$). The second refractory metal may be the same as or different from the first refractory metal and the second impurity may be the same as or different from the first impurity. The second refractory metal material has a lower affinity for the impurities such that there is a net migration of impurities out of the second refractory material and into the first refractory metal during an anneal or other such exposure to heat. For one embodiment, the second refractory metal material contains the second impurity at a level higher than the stoichiometric level, i.e., the second refractory metal material is saturated with the second impurity.

The second refractory metal material serves as a barrier layer and thus generally has a thickness larger than the first refractory metal material. As the second refractory metal material is separated from underlying silicon-containing materials, formation of silicide with the second refractory metal material is generally not a concern. The second refractory metal material can be formed through any suitable technique, such as CVD or PVD techniques. For one embodiment, the second refractory metal material has a thickness of approximately 50–200 Å. For a further embodiment, the second refractory metal material has a thickness of approximately 150 Å.

For one embodiment, the second impurity is nitrogen such that the second refractory metal material forms a second refractory metal nitride layer. For a further embodiment, the second refractory metal is tungsten such that the second refractory metal nitride layer is a tungsten nitride ($WN_x$) layer 250.

It is noted that a bit-line stack using a tungsten layer overlying a tungsten nitride barrier layer can produce a bit line resistance of approximately 20–30% lower than using a tungsten layer alone. However, a tungsten nitride layer adjoining a silicon-containing contact plug may produce an undesirably high vertical contact resistance, thus reducing the advantage of the tungsten/tungsten nitride combination. Various embodiments of the invention facilitate use of this tungsten/tungsten nitride combination while reducing vertical contact resistance.

For embodiments using nitrogen as the first and second impurities, the first refractory metal nitride layer should have a higher affinity for nitrogen than the second refractory metal nitride layer such that an unsaturated first refractory metal nitride layer can accept nitrogen from the second refractory metal nitride layer during an anneal or other exposure to heat. The second refractory metal nitride layer can be either saturated or unsaturated as long as it is capable of acting as a nitrogen donor to the first refractory metal nitride layer. Accordingly, the second refractory metal nitride layer has an atomic ratio of nitrogen to its refractory metal component of greater than zero, provided it can act as a nitrogen donor. For one embodiment, the atomic ratio of nitrogen to the refractory metal component of the second refractory metal nitride layer is greater than or equal to a stoichiometric level, i.e., the second refractory metal nitride layer is a saturated or nitrogen-rich refractory metal nitride material.

As one example, titanium has a higher affinity for nitrogen than tungsten. An unsaturated titanium nitride layer can thus accept nitrogen from a donor layer of tungsten nitride. Accordingly, during an anneal of the structure described with reference to FIG. 3, nitrogen from the tungsten nitride layer 250 will migrate into the titanium nitride layer 245. This downward migration of nitrogen will impede any upward migration of silicon, thus limiting silicide formation to a lower portion of the unsaturated titanium nitride layer 245. Silicide formation is impeded because titanium nitride nuclei are already formed in the titanium nitride layer 245, thus providing titanium nitride with a lower free energy of formation than titanium silicide in the competing reactions. In this manner, the thickness of the metal silicide interface is limited, thereby reducing agglomeration concerns and improving thermal tolerance of the metal silicide interface and the resulting device.

By regulating the growth of the metal silicide interface and thus limiting its thickness, a wider process window is achieved for fabrication of integrated circuit devices. This wider process window is the result of increased tolerance to higher temperatures during subsequent processing. For one embodiment, the metal silicide interface ranges from 2 atomic layers to approximately 60 Å. For a further embodiment, the metal silicide interface is less than approximately 10 Å. For a still further embodiment, the metal silicide interface is approximately 5–10 Å.

Figure 2D:
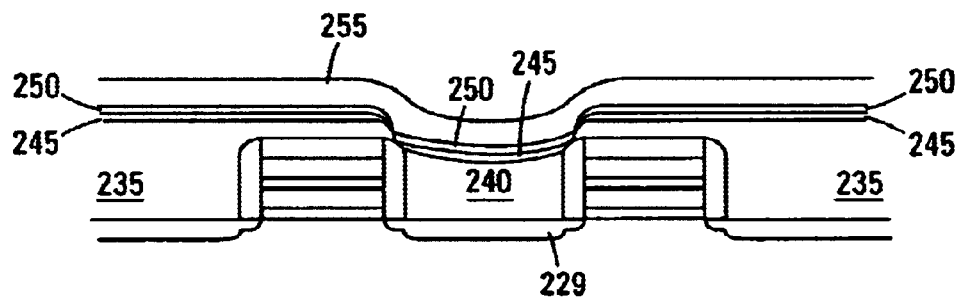

In FIG. 2D, a conductor layer such as tungsten layer 255 is formed adjoining at least the second refractory metal material overlying the contact plug 240. Although the first refractory metal material, or titanium nitride layer 245, and the second refractory metal material, or tungsten nitride layer 250, are shown to remain overlying the insulator layer 235, these portions may be removed prior to formation of the conductor layer 255. Removal techniques such as CMP may be used.

The conductor layer serves as a bit line of the memory device and may contain any conductive material. However, the conductor layer generally contains a metal to reduce resistance in light of decreasing cross-sectional areas used to increase device density. Some specific metals include refractory metals, aluminum (Al) and copper (Cu), as well as metals of the platinum and noble metals groups. The bit-line stack of various embodiments includes the optional silicon-containing contact plug, the two refractory metal nitride layers and the bit line.

Figure 4A:
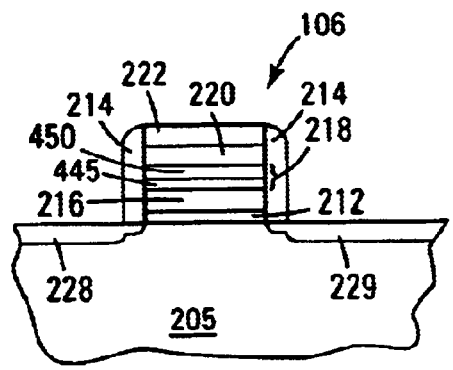
FIG. 4A is a cross-sectional view of a word line having a compound structure in accordance with an embodiment of the invention.
Figure 4B:
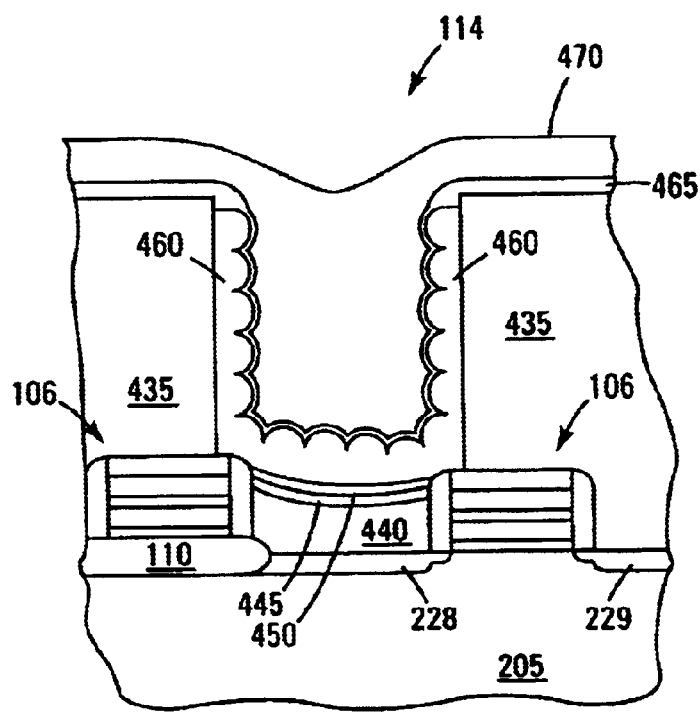
FIG. 4B is a cross-sectional view of a memory cell capacitor having a compound structure in accordance with an embodiment of the invention.

While the foregoing description utilized the compound structure of the invention to reduce resistance of bit-line contacts, the principles of the invention are applicable for other uses. As one example, refractory metal nitride layers are commonly used in memory array word lines as barrier layers between a silicon-containing layer and a metal layer. By using the compound structure of two refractory metal materials as described herein, silicide formation can be limited to a lower portion of the first refractory metal material for good ohmic contact with reduced agglomeration concerns and improved thermal tolerance. Similar to bit lines, a memory cell capacitor must generally have low resistance between its bottom plate and a source/drain region of the access transistor. FIG. 4A is a cross-sectional view of a word line 106 having a compound structure in accordance with an embodiment of the invention while FIG. 4B is a cross-sectional view of a memory cell capacitor 114 having a compound structure in accordance with an embodiment of the invention. In FIGS. 4A–4B, elements described with reference to other figures are indicated by like numbers and their details will not be repeated. While the following examples describe use of refractory metal nitride layers in particular, other refractory metal materials can be used. Examples include conductive refractory metal boride layers, conductive refractory metal carbide layers and conductive refractory metal oxide layers.

In FIG. 4A, the gate barrier layer 218 is shown to include a first refractory metal nitride layer 445 and a second refractory metal nitride layer 450. The second refractory metal nitride layer 450 is formed overlying, and may be adjoining, the first refractory metal nitride layer 445. The second refractory metal nitride layer 450 is a nitrogen donor while the first refractory metal nitride layer 445 is a nitrogen acceptor such that silicide formation between the gate polysilicon layer 216 and the first refractory metal nitride layer 445 is limited to a lower portion of the first refractory metal nitride layer 445. The compound structure of the first refractory metal nitride layer 445 and the second refractory metal nitride layer 450 can reduce contact resistance between the gate conductor layer 220 and the gate polysilicon layer 216 or other silicon-containing layer.

In FIG. 4B, the memory cell capacitor 114 is formed in an insulator layer 435 and includes a bottom plate 460, a dielectric layer 465 and a top plate 470. The bottom plate 460 contains some conductive material and is commonly a conductively-doped hemispherical grain (HSG) polysilicon for increased surface area. For additional embodiments, the conductive material of the bottom plate 460 may contain metals, metal nitrides, metal alloys or conductive metal oxides. The dielectric layer 465 contains some dielectric material. Common dielectric materials include silicon oxides, silicon nitrides and silicon oxynitrides as well as dielectric metal oxides. The top plate 470 is some conductive material and is commonly conductively-doped polysilicon. The top plate 470 is generally shared among all or a portion of the memory cells of the memory array.

The capacitor 114 is coupled to the first source/drain region 228 through a silicon-containing contact plug 440, such as a conductively-doped polysilicon plug. A compound structure containing a first refractory metal nitride layer 445 and a second refractory metal nitride layer 450 is formed between the bottom plate 460 and the contact plug 440. The second refractory metal nitride layer 450 is formed overlying, and may be adjoining, the first refractory metal nitride layer 445. The second refractory metal nitride layer 450 is a nitrogen donor while the first refractory metal nitride layer 445 is a nitrogen acceptor such that silicide formation between the silicon-containing contact plug 440 and the first refractory metal nitride layer 445 is limited to a lower portion of the first refractory metal nitride layer 445. The compound structure of the first refractory metal nitride layer 445 and the second refractory metal nitride layer 450 can reduce contact resistance between the bottom plate 460 and the contact plug 440 or other silicon-containing layer. For one embodiment, the contact plug 440 is eliminated such that the first refractory metal layer 445 is formed overlying and adjoining the first source/drain region 228.

While the second refractory metal materials of the various embodiments have been shown to be adjoining their respective first refractory metal materials, there is no requirement that such layers be adjoining. However, any interposing layer should be a conductive material and must allow migration of impurities from the second refractory metal material to the first refractory metal material to impede silicide formation as described herein.

Figure 5A:
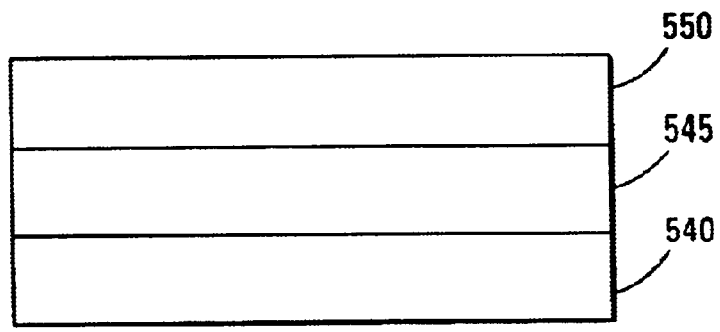
FIGS. 5A–5B are cross-sectional views showing the formation of a silicide layer in a compound structure in accordance with an embodiment of the invention.
Figure 5B:
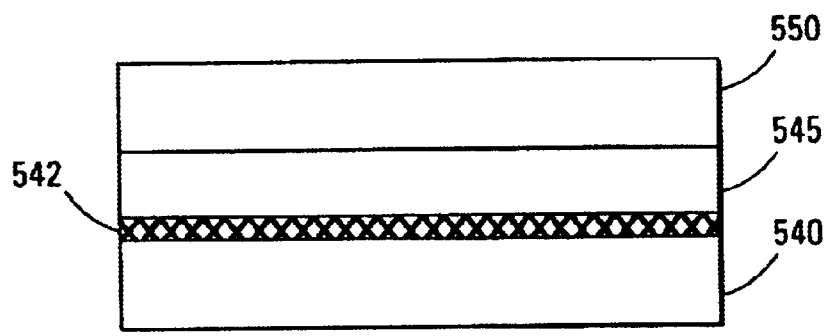

FIGS. 5A–5B are cross-sectional views showing an example of the formation of a silicide interface in accordance with the various embodiments. In FIG. 5A, a first refractory metal material 545 has been formed on a silicon-containing layer 540 and a second refractory metal material 550 has been formed on the first refractory metal material 545. FIG. 5B shows the formation of a silicide layer 542, such as might be formed by an annealing process, at the interface of the first refractory metal material 545 and the silicon-containing containing layer 540. The silicide layer 542 is limited to a lower portion of the first refractory metal material 545, assisted by downward migration of the impurity from the second refractory metal material 550.

Figure 6:
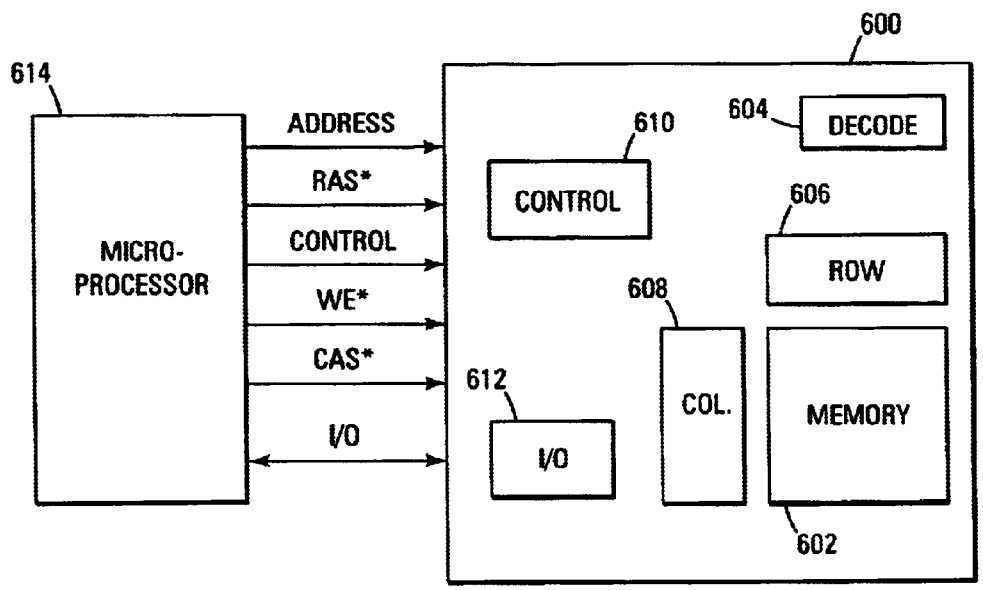
FIG. 6 is a simplified block diagram of an integrated circuit memory device in accordance with an embodiment of the invention.

FIG. 6 is a simplified block diagram of an integrated circuit memory device as a dynamic memory device in accordance with an embodiment of the invention. The memory device 600 includes an array of memory cells 602, an address decoder 604, row access circuitry 606, column access circuitry 608, control circuitry 610, and Input/Output (I/O) circuitry 612. The memory device 600 can be coupled to an external microprocessor 614, or memory controller for memory accessing. The memory device 600 receives control signals from the processor 614, such as WE*, RAS* and CAS* signals. The memory cells are used to store data that are accessed via I/O lines. The memory cells are accessed in response to the control signals and the address signals. It will be appreciated by those skilled in the art that additional circuitry and control signals can be provided, and that the memory device of FIG. 6 has been simplified to help focus on the invention. For one embodiment, at least one bit-line contact of the array of memory cells 602 has a compound structure in accordance with the invention. For another embodiment, at least one memory cell of the array of memory cells 602 has a capacitor contact having compound structure in accordance with the invention. For yet another embodiment, at least one word line of the array of memory cells 602 has a compound structure in accordance with the invention.

It will be understood that the above description of a DRAM (Dynamic Random Access Memory) is intended to provide a general understanding of the memory and is not a complete description of all the elements and features of a DRAM. Further, the invention is equally applicable to a variety of sizes and types of memory circuits known in the art and is not intended to be limited to the DRAM described above.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

The foregoing figures were used to aid the understanding of the accompanying text. However, the figures are not drawn to scale and relative sizing of individual features and layers are not necessarily indicative of the relative dimensions of such individual features or layers in application. Accordingly, the drawings are not to be used for dimensional characterization.

CONCLUSION

As device sizes are decreased, reduction of contact resistance becomes more critical. A common method of reducing contact resistance to a silicon-containing material is to form a metal silicide interface. One concern in using such a metal silicide interface is agglomeration. Agglomeration of the metal silicide interface may occur when exposed to heat if the metal silicide interface is allowed to grow too thick. The various embodiments of the invention provide a compound structure for limiting growth of the metal silicide interface, leading to a reduced concern of agglomeration and thus a higher thermal tolerance of the resulting device.

Various embodiments of the invention reduce contact resistance to a silicon-containing material using a first refractory metal material overlying the silicon-containing material and a second refractory metal material overlying the first refractory metal material. Each refractory metal material is a conductive material containing a refractory metal and an impurity capable of forming a chemical bond with the refractory metal. The first refractory metal material is a metal-rich material, containing a level of its impurity at less than a stoichiometric level. The second refractory metal material has a lower affinity for the impurities than does the first refractory metal material. As such, the second refractory metal material can serve as an impurity donor during an anneal or other exposure to heat. This net migration of the impurities from the second refractory metal material to the first refractory metal material limits growth of a metal silicide interface between the first refractory metal material and the underlying silicon-containing material, thereby providing ohmic contact with attendant thermal tolerance.

While the invention has been described and illustrated with respect to memory device, it should be apparent that the same processing techniques can be used to form compound structures for reduced contact resistance in other applications and other intergrated circuit devices.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. For example, other materials, shapes, deposition techniques and removal techniques may be utilized with the invention. Accordingly, this application is intended to cover any adaptations or variations of the invention. It is manifestly intended that this invention be limited only by the following claims and equivalents thereof.

What is claimed is:

1. A compound structure for reduced contact resistance to a silicon-containing material, comprising:
    a first refractory metal material overlying the silicon-containing material, wherein the first refractory metal material is a conductive material containing a first refractory metal and a first impurity capable of forming a chemical bond with the first refractory metal; and
    a second refractory metal material overlying the first refractory metal material, wherein the second refractory metal material is a conductive material containing a second refractory metal and a second impurity capable of forming a chemical bond with the second refractory metal;
    wherein the first refractory metal material contains the first impurity at a level less than a stoichiometric level;
    wherein the second refractory metal material has a lower affinity for the first and second impurities than does the first refractory metal material; and
    wherein the second refractory metal material can serve as an impurity donor to the first refractory metal material during an anneal or other exposure to heat.

2. A compound structure for reduced contact resistance to a silicon-containing material, comprising:
    a first refractory metal material overlying the silicon-containing material, wherein the first refractory metal material is a conductive material containing a first refractory metal and a first impurity capable of forming a chemical bond with the first refractory metal; and
    a second refractory metal material overlying the first refractory metal material, wherein the second refractory metal material is a conductive material containing a second refractory metal and a second impurity capable of forming a chemical bond with the second refractory metal;
    wherein the first refractory metal material contains the first impurity at a level less than a stoichiometric level;
    wherein the second refractory metal material has a lower affinity for the first and second impurities than does the first refractory metal material; and
    wherein the first and second impurities are each selected from the group consisting of boron, carbon, nitrogen and oxygen.

3. A compound structure for reduced contact resistance to a silicon-containing material, comprising:
    a first refractory metal material overlying the silicon-containing material, wherein the first refractory metal material is a conductive material containing a first refractory metal and a first impurity capable of forming a chemical bond with the first refractory metal; and
    a second refractory metal material overlying the first refractory metal material, wherein the second refractory metal material is a conductive material containing a second refractory metal and a second impurity capable of forming a chemical bond with the second refractory metal;
    wherein the first refractory metal material contains the first impurity at a level less than a stoichiometric level;
    wherein the second refractory metal material has a lower affinity for the first and second impurities than does the first refractory metal material; and
    wherein the first refractory metal is different from the second refractory metal.

4. A compound structure for reduced contact resistance to a silicon-containing material, comprising:
    a first refractory metal material overlying the silicon-containing material, wherein the first refractory metal material is a conductive material containing a first refractory metal and a first impurity capable of forming a chemical bond with the first refractory metal; and
    a second refractory metal material overlying the first refractory metal material, wherein the second refractory metal material is a conductive material containing a second refractory metal and a second impurity capable of forming a chemical bond with the second refractory metal;
    wherein the first refractory metal material contains the first impurity at a level less than a stoichiometric level;
    wherein the second refractory metal material has a lower affinity for the first and second impurities than does the first refractory metal material; and
    wherein the second refractory metal material contains the second impurity at a level higher than a stoichiometric level.

5. A compound structure for reduced contact resistance to a silicon-containing material, comprising:

a first refractory metal nitride layer overlying the silicon-containing material, wherein the first refractory metal nitride layer is an unsaturated refractory metal nitride material; and a second refractory metal nitride layer overlying the first refractory metal nitride layer, wherein the second refractory metal nitride layer has a lower affinity for nitrogen than the first refractory metal nitride layer;

wherein the first refractory metal nitride layer has a bulk resistivity within 15% of its unsaturated maximum bulk resistivity.

6. The compound structure of claim 5, wherein the first refractory metal nitride layer has a bulk resistivity within 5% of its unsaturated maximum bulk resistivity.

7. The compound structure of claim 5, wherein the first refractory metal nitride layer has a bulk resistivity approximately equal to its unsaturated maximum bulk resistivity.

8. A compound structure for reduced contact resistance to a silicon-containing material, comprising:

a first refractory metal nitride layer overlying the silicon-containing material, wherein the first refractory metal nitride layer is an unsaturated refractory metal nitride material; and a second refractory metal nitride layer overlying the first refractory metal nitride layer, wherein the second refractory metal nitride layer has a lower affinity for nitrogen than the first refractory metal nitride layer;

wherein the second refractory metal nitride layer contains a saturated refractory metal nitride material.

9. A compound structure for reduced contact resistance to a silicon-containing material, comprising:

a first refractory metal nitride layer overlying the silicon-containing material, wherein the first refractory metal nitride layer is an unsaturated refractory metal nitride material; and a second refractory metal nitride layer overlying the first refractory metal nitride layer, wherein the second refractory metal nitride layer has a lower affinity for nitrogen than the first refractory metal nitride layer;

wherein the first refractory metal nitride layer contains a different refractory metal than the second refractory metal nitride layer.

10. The compound structure of claim 9, wherein the first refractory metal nitride layer contains a titanium nitride material and the second refractory metal nitride layer contains a tungsten nitride material.

11. A compound structure for reduced contact resistance to a silicon-containing material, comprising:

a first refractory metal nitride layer overlying the silicon-containing material, wherein the first refractory metal nitride layer is an unsaturated refractory metal nitride material; and a second refractory metal nitride layer overlying the first refractory metal nitride layer, wherein the second refractory metal nitride layer has a lower affinity for nitrogen than the first refractory metal nitride layer;

wherein the first refractory metal nitride layer has a thickness of approximately 50–90 Å.

12. The compound structure of claim 11, wherein the first refractory metal nitride layer has a thickness of approximately 75–90 Å.

13. A compound structure for reduced contact resistance to a silicon-containing material, comprising:

a first refractory metal nitride layer overlying the silicon-containing material, wherein the first refractory metal nitride layer is an unsaturated refractory metal nitride material; and a second refractory metal nitride layer overlying the first refractory metal nitride layer, wherein the second refractory metal nitride layer has a lower affinity for nitrogen than the first refractory metal nitride layer;

wherein the first refractory metal nitride layer is adjoining the silicon-containing material and the second refractory metal nitride layer is adjoining the first refractory metal nitride layer.

14. A compound structure for reduced contact resistance to a silicon-containing material, comprising:

a first refractory metal nitride layer overlying the silicon-containing material, wherein the first refractory metal nitride layer has a refractory metal component and wherein an atomic ratio of nitrogen to the refractory metal component of the first refractory metal nitride layer is less than one; and a second refractory metal nitride layer overlying the first refractory metal nitride layer, wherein the second refractory metal nitride layer has a lower affinity for nitrogen than the first refractory metal nitride layer;

wherein the first refractory metal nitride layer has a bulk resistivity within 15% of its unsaturated maximum bulk resistivity.

15. The compound structure of claim 14, wherein the first refractory metal nitride layer has a bulk resistivity approximately equal to its unsaturated maximum bulk resistivity.

16. A compound structure for reduced contact resistance to a silicon-containing material, comprising:

a first refractory metal nitride layer overlying the silicon-containing material, wherein the first refractory metal nitride layer has a refractory metal component and wherein an atomic ratio of nitrogen to the refractory metal component of the first refractory metal nitride layer is less than one; and a second refractory metal nitride layer overlying the first refractory metal nitride layer, wherein the second refractory metal nitride layer has a lower affinity for nitrogen than the first refractory metal nitride layer;

wherein the second refractory metal nitride layer has a refractory metal component and wherein an atomic ratio of nitrogen to the refractory metal component of the second refractory metal nitride layer is greater than or equal to one.

17. A compound structure for reduced contact resistance to a silicon-containing material, comprising:

a titanium nitride layer overlying the silicon-containing material, wherein the titanium nitride layer is formed by reactive sputtering from a titanium target in a nitrogen-containing ambient to produce an unsaturated titanium nitride material having a bulk resistivity within 15% of a maximum unsaturated bulk resistivity; and a refractory metal nitride layer overlying the titanium nitride layer;

wherein the refractory metal nitride layer has a lower affinity for nitrogen than the titanium nitride layer.

18. A compound structure for reduced contact resistance to a silicon-containing material, comprising:

a titanium nitride layer overlying the silicon-containing material, wherein the titanium nitride layer is formed by reactive sputtering from a titanium target in a nitrogen-containing ambient to produce an unsaturated titanium nitride material of the form $TiN_x$ where x is in the range of approximately 0.2 to approximately 0.8; and a refractory metal nitride layer overlying the titanium nitride layer.

19. The compound structure of claim 18, wherein the refractory metal nitride layer is a saturated refractory metal nitride material.

20. The compound structure of claim 18, wherein the refractory metal nitride layer has a lower affinity for nitrogen than the titanium nitride layer.

21. The compound structure of claim 18, wherein x is in the range of approximately 0.4 to approximately 0.7.

22. The compound structure of claim 18, wherein x is in the range of approximately 0.5 to approximately 0.6.

23. A compound structure for reduced contact resistance to a silicon-containing material, comprising:

a titanium nitride layer overlying the silicon-containing material, wherein the titanium nitride layer is of the form $TiN_x$ where x ranges from approximately 0.2 to approximately 0.8; and a refractory metal nitride layer overlying the titanium nitride layer, wherein the refractory metal nitride layer has a lower affinity for nitrogen than the titanium nitride layer.

24. The compound structure of claim 23, wherein x ranges from approximately 0.5 to approximately 0.6.

25. A compound structure for reduced contact resistance to a silicon-containing material, comprising:

a first refractory metal nitride layer on the silicon-containing material, wherein the first refractory metal nitride layer is a nitrogen acceptor; and a second refractory metal nitride layer on the first refractory metal nitride layer, wherein the second refractory metal nitride layer is a nitrogen donor to the first refractory metal nitride layer.

26. The compound structure of claim 25, wherein the first refractory metal nitride layer contains a titanium nitride material and the second refractory metal nitride layer contains a tungsten nitride material.

27. The compound structure of claim 25, wherein the first refractory metal nitride layer contains an unsaturated titanium nitride material of the form $TiN_x$ where x is in the range of approximately 0.2 to approximately 0.8.

28. The compound structure of claim 25, wherein the first refractory metal nitride layer contains an unsaturated refractory metal nitride material having a bulk resistivity within 15% of an unsaturated maximum bulk resistivity.

29. A bit-line contact, comprising:

a first refractory metal nitride layer overlying a silicon-containing material;

a refractory metal suicide interface between the first refractory metal nitride layer and the silicon-containing material, wherein the refractory metal suicide interface is limited to a lower portion of the first refractory metal nitride layer; and a second refractory metal nitride layer overlying the first refractory metal nitride layer.

30. The bit-line contact of claim 29, wherein the silicon-containing material is a conductively-doped polysilicon contact plug.

31. The bit-line contact of claim 29, wherein the silicon-containing material is a conductively-doped source/drain region.

32. The bit-line contact of claim 29, wherein the silicon-containing material is a silicon-containing layer of a multiple-layer structure.

33. A bit-line contact, comprising:

a first refractory metal nitride layer adjoining a silicon-containing contact plug; and a second refractory metal nitride layer overlying the first refractory metal nitride layer;

wherein the first refractory metal nitride layer is an unsaturated refractory metal nitride material; and wherein the first refractory metal nitride layer has a higher affinity for nitrogen than the second refractory metal nitride layer.

34. The bit-line contact of claim 33, wherein the first refractory metal nitride layer has a bulk resistivity within 15% of its unsaturated maximum bulk resistivity.

35. The bit-line contact of claim 33, wherein the first refractory metal nitride layer has a bulk resistivity approximately equal to its unsaturated maximum bulk resistivity.

36. A bit-line contact, comprising:

a conductively-doped polysilicon contact plug;

an unsaturated titanium nitride layer overlying the conductively-doped polysilicon contact plug; and a tungsten nitride layer overlying the unsaturated titanium nitride layer.

37. The bit-line contact of claim 36, wherein the tungsten nitride layer contains a nitrogen-rich tungsten nitride material.

38. The bit-line contact of claim 37, wherein the unsaturated titanium nitride layer has a bulk resistivity within 15% of its unsaturated maximum bulk resistivity.

39. The bit-line contact of claim 36, wherein the tungsten nitride layer has a lower affinity for nitrogen than the unsaturated titanium nitride layer.

40. The bit-line contact of claim 39, wherein the unsaturated titanium nitride layer has a bulk resistivity approximately equal to its unsaturated maximum bulk resistivity.

41. The bit-line contact of claim 36, wherein the unsaturated titanium nitride layer contains a titanium nitride material of the form $TiN_x$ where x ranges from approximately 0.2 to approximately 0.8.

42. The bit-line contact of claim 36, wherein the unsaturated titanium nitride layer contains a titanium nitride material of the form $TiN_x$ where x ranges from approximately 0.5 to approximately 0.6.

43. A bit-line contact, comprising:

an unsaturated titanium nitride layer adjoining a silicon-containing material, wherein the silicon-containing material is selected from the group consisting of a conductively-doped polysilicon contact plug and a conductively-doped source/drain region; and a tungsten nitride layer overlying the unsaturated titanium nitride layer and having a lower affinity for nitrogen than the titanium nitride layer;

wherein the unsaturated titanium nitride layer has a bulk resistivity within 15% of a maximum unsaturated bulk resistivity.

44. A bit-line contact, comprising:

a titanium nitride layer adjoining a silicon-containing material, wherein the titanium nitride layer is formed by a physical vapor deposition process to be an unsaturated titanium nitride material and to have a bulk resistivity within 15% of a maximum unsaturated bulk resistivity; and a tungsten nitride layer overlying the titanium nitride layer.

45. A bit-line contact, comprising:

a titanium nitride layer adjoining a silicon-containing material, wherein the titanium nitride layer is formed by reactive sputtering from a titanium target in a nitrogen-containing ambient to produce an unsaturated titanium nitride material having a bulk resistivity within 15% of a maximum unsaturated bulk resistivity; and a refractory metal nitride layer overlying the titanium nitride layer.

46. A bit-line contact, comprising:

a titanium nitride layer adjoining a silicon-containing material, wherein the titanium nitride layer is formed by reactive sputtering from a titanium target in a nitrogen-containing ambient to produce an unsaturated titanium nitride material of the form $TiN_x$ where x is in the range of approximately 0.2 to approximately 0.8; and a refractory metal nitride layer overlying the titanium nitride layer.

47. The bit-line contact of claim 46, wherein x is in the range of approximately 0.5 to approximately 0.6.

48. A bit-line contact, comprising:

a titanium nitride layer adjoining a silicon-containing material, wherein the titanium nitride layer is of the form $TiN_x$ where x ranges from approximately 0.2 to approximately 0.8; and a refractory metal nitride layer overlying the titanium nitride layer, wherein the refractory metal nitride layer has a lower affinity for nitrogen than the titanium nitride layer.

49. The bit-line contact of claim 48, wherein x ranges from approximately 0.5 to approximately 0.6.

50. A bit-line stack, comprising:

a conductively-doped polysilicon contact plug;

an unsaturated titanium nitride layer overlying the conductively-doped polysilicon contact plug;

a titanium silicide interface between the polysilicon contact plug and the unsaturated titanium nitride layer;

a tungsten nitride layer overlying the unsaturated titanium nitride layer; and a tungsten layer overlying the tungsten nitride layer.

51. The bit-line stack of claim 50, wherein the tungsten nitride layer contains a nitrogen-rich tungsten nitride material.

52. The bit-line stack of claim 50, wherein the tungsten nitride layer has a lower affinity for nitrogen than the unsaturated titanium nitride layer.

53. The bit-line stack of claim 50, wherein the unsaturated titanium nitride layer has a bulk resistivity within 15% of its unsaturated maximum bulk resistivity.

54. The bit-line stack of claim 50, wherein the unsaturated titanium nitride layer has a bulk resistivity within 5% of its unsaturated maximum bulk resistivity.

55. The bit-line stack of claim 50, wherein the unsaturated titanium nitride layer has a bulk resistivity approximately equal to its unsaturated maximum bulk resistivity.

56. The bit-line stack of claim 50, wherein the unsaturated titanium nitride layer contains a titanium nitride material of the form $TiN_x$ where x ranges from approximately 0.2 to approximately 0.8.

57. The bit-line stack of claim 50, wherein the unsaturated titanium nitride layer contains a titanium nitride material of the form $TiN_x$ where x ranges from approximately 0.4 to approximately 0.7.

58. The bit-line stack of claim 50, wherein the unsaturated titanium nitride layer contains a titanium nitride material of the form $TiN_x$ where x ranges from approximately 0.5 to approximately 0.6.

59. A bit-line stack, comprising:

an unsaturated titanium nitride layer adjoining a silicon-containing material and having a titanium silicide interface formed therebetween, wherein the silicon-containing material is selected from the group consisting of a conductively-doped polysilicon contact plug and a conductively-doped source/drain region;

a tungsten nitride layer overlying the unsaturated titanium nitride layer and having a lower affinity for nitrogen than the unsaturated titanium nitride layer; and a tungsten layer overlying the tungsten nitride layer;

wherein the unsaturated titanium nitride layer has a bulk resistivity within 15% of a maximum unsaturated bulk resistivity.

60. A bit-line stack, comprising:

a titanium nitride layer adjoining a silicon-containing material, wherein the titanium nitride layer is formed by reactive sputtering from a titanium target in a nitrogen-containing ambient to produce an unsaturated titanium nitride material of the form $TiN_x$ where x is in the range of approximately 0.2 to approximately 0.8;

a tungsten nitride layer overlying the titanium nitride layer; and a tungsten layer overlying the tungsten nitride layer.

61. The bit-line stack of claim 60, wherein x is in the range of approximately 0.5 to approximately 0.6.

62. The bit-line stack of claim 60, wherein the tungsten nitride layer has a lower affinity to nitrogen than the titanium nitride layer.

63. The bit-line stack of claim 60, further comprising a titanium silicide interface formed in a lower portion of the titanium nitride layer.

64. A word line for a memory cell, comprising:

a gate dielectric layer;

a gate polysilicon layer overlying the gate dielectric layer;

an unsaturated titanium nitride layer overlying the gate polysilicon layer;

a tungsten nitride layer overlying the unsaturated titanium nitride layer; and a gate conductor layer overlying the tungsten nitride layer.

65. The word line of claim 64, further comprising:

a titanium silicide interface formed between the unsaturated titanium nitride layer and the gate polysilicon layer.

66. The word line of claim 64, wherein the unsaturated titanium nitride layer has a bulk resistivity within 15% of its unsaturated maximum bulk resistivity.

67. The word line of claim 64, wherein the tungsten nitride layer has a lower affinity for nitrogen than the unsaturated titanium nitride layer.

68. The word line of claim 67, wherein the unsaturated titanium nitride layer has a bulk resistivity approximately equal to its unsaturated maximum bulk resistivity.

69. The word line of claim 64, wherein the unsaturated titanium nitride layer contains a titanium nitride material of the form $TiN_x$ where x ranges from approximately 0.5 to approximately 0.6.

70. A word line for a memory cell, comprising:

a gate dielectric layer;

a conductively-doped gate polysilicon layer overlying the gate dielectric layer;

an unsaturated titanium nitride layer overlying the conductively-doped gate polysilicon layer;

a tungsten nitride layer overlying the unsaturated titanium nitride layer and having a lower affinity for nitrogen than the unsaturated titanium nitride layer; and a gate conductor layer overlying the tungsten nitride layer;

wherein the unsaturated titanium nitride layer has a bulk resistivity within 15% of a maximum unsaturated bulk resistivity.

71. The word line of claim 70, further comprising:

a titanium silicide interface formed between the unsaturated titanium nitride layer and the conductively-doped gate polysilicon layer.

72. A word line for a memory cell, comprising:

a gate dielectric layer;

a conductively-doped gate polysilicon layer overlying the gate dielectric layer;

a titanium nitride layer overlying the gate polysilicon layer, wherein the titanium nitride layer is formed by a physical vapor deposition process to be an unsaturated titanium nitride material and to have a bulk resistivity within 15% of a maximum unsaturated bulk resistivity;

a tungsten nitride layer overlying the titanium nitride layer; and a gate conductor layer overlying the tungsten nitride layer.

73. The word line of claim 72, comprising:

a titanium suicide interface formed between the titanium nitride layer and the conductively-doped gate polysilicon layer.

74. The word line of claim 72, wherein the tungsten nitride layer has a lower affinity for nitrogen than the titanium nitride layer.

75. The word line of claim 72, wherein the tungsten nitride layer contains a nitrogen-rich tungsten nitride material.

76. A word line for a memory cell, comprising:

a gate dielectric layer;

a conductively-doped gate polysilicon layer overlying the gate dielectric layer;

a titanium nitride layer overlying the gate polysilicon layer, wherein the titanium nitride layer is formed by reactive sputtering from a titanium target in a nitrogen-containing ambient to produce an unsaturated titanium nitride material having a bulk resistivity within 15% of a maximum unsaturated bulk resistivity;

a titanium suicide interface formed in a lower portion of the titanium nitride layer;

a refractory metal nitride layer overlying the titanium nitride layer; and a gate conductor layer overlying the refractory metal nitride layer.

77. A word line for a memory cell, comprising:

a gate dielectric layer;

a conductively-doped gate polysilicon layer overlying the gate dielectric layer;

a titanium nitride layer overlying the gate polysilicon layer, wherein the titanium nitride layer is formed by reactive sputtering from a titanium target in a nitrogen-containing ambient to produce an unsaturated titanium nitride material of the form $TiN_x$ where x is in the range of approximately 0.2 to approximately 0.8;

a titanium silicide interface formed in a lower portion of the titanium nitride layer;

a refractory metal nitride layer overlying the titanium nitride layer; and a gate conductor layer overlying the refractory metal nitride layer.

78. The word line of claim 77, wherein x is in the range of approximately 0.5 to approximately 0.6.

79. A word line for a memory cell, comprising:

a gate dielectric layer;

a conductively-doped gate polysilicon layer overlying the gate dielectric layer;

a titanium nitride layer overlying the gate polysilicon layer, wherein the titanium nitride layer is of the form $TiN_x$ where x ranges from approximately 0.2 to approximately 0.8;

a refractory metal nitride layer overlying the titanium nitride layer, wherein the refractory metal nitride layer has a lower affinity for nitrogen than the titanium nitride layer; and a gate conductor layer overlying the refractory metal nitride layer.

80. The word line of claim 79, wherein x ranges from approximately 0.5 to approximately 0.6.

81. A memory cell, comprising:

a gate stack overlying a silicon substrate;

a first source/drain region and a second source/drain region in the silicon substrate on opposing sides of the gate stack;

a capacitor having a bottom plate, a top plate and a dielectric layer interposed between the bottom plate and the top plate;

a titanium nitride layer adjoining a silicon-containing material, wherein the titanium nitride layer is formed by reactive sputtering from a titanium target in a nitrogen-containing ambient to produce an unsaturated titanium nitride material having a bulk resistivity within 15% of a maximum unsaturated bulk resistivity, and wherein the silicon-containing material is selected from the group consisting of the first source/drain region and a silicon-containing contact plug adjoining the first source/drain region;

a titanium silicide layer at the interface of the titanium nitride layer and the silicon-containing material; and a refractory metal nitride layer overlying the titanium nitride layer, wherein the refractory metal nitride layer is coupled to the bottom plate of the capacitor.

82. The memory cell of claim 81, wherein the refractory metal nitride layer has a lower affinity for nitrogen than the titanium nitride layer.

83. A memory cell, comprising:

a gate stack overlying a silicon substrate;

a first source/drain region and a second source/drain region in the silicon substrate on opposing sides of the gate stack;

a capacitor having a bottom plate, a top plate and a dielectric layer interposed between the bottom plate and the top plate;

a titanium nitride layer overlying a silicon-containing material, wherein the titanium nitride layer is formed by reactive sputtering from a titanium target in a nitrogen-containing ambient to produce an unsaturated titanium nitride material of the form $TiN_x$ where x is in the range of approximately 0.2 to approximately 0.8, and wherein the silicon-containing material is selected from the group consisting of the first source/drain region and a silicon-containing contact plug adjoining the first source/drain region;

a titanium silicide interface between the titanium nitride layer and the silicon-containing material; and a refractory metal nitride layer overlying the titanium nitride layer, wherein the refractory metal nitride layer is coupled to the bottom plate of the capacitor.

84. The memory cell of claim 83, wherein the refractory metal nitride layer has a lower affinity for nitrogen than the titanium nitride layer.

85. The memory cell of claim 83, wherein x is in the range of approximately 0.5 to approximately 0.6.

86. A memory device, comprising:

a plurality of bit lines, wherein each bit line contains tungsten;

a plurality of word lines; and an array of memory cells, each memory cell located at an intersection of a bit line and a word line and each memory cell having a source/drain region coupled to a bit line through a bit-line contact;

wherein at least one bit-line contact comprises:

an unsaturated titanium nitride layer adjoining a silicon-containing material and having a titanium silicide interface formed therebetween, wherein the silicon-containing material is selected from the group consisting of a source/drain region associated with the bit-line contact and a conductively-doped polysilicon contact plug coupled to the source/drain region associated with the bit-line contact; and a tungsten nitride layer overlying the unsaturated titanium nitride layer and having a lower affinity for nitrogen than the unsaturated titanium nitride layer.

87. A memory device, comprising:

a plurality of bit lines;

a plurality of word lines; and an array of memory cells, each memory cell located at an intersection of a bit line and a word line;

wherein at least one word line comprises:

a gate dielectric layer;

a gate polysilicon layer overlying the gate dielectric layer;

an unsaturated titanium nitride layer overlying the gate polysilicon layer;

a titanium silicide layer formed at an interface between the unsaturated titanium nitride layer and the gate polysilicon layer;

a tungsten nitride layer overlying the unsaturated titanium nitride layer, wherein the tungsten nitride layer has a lower affinity for nitrogen than the unsaturated titanium nitride layer; and a tungsten layer overlying the tungsten nitride layer.

88. A memory device, comprising:

a plurality of bit lines;

a plurality of word lines; and an array of memory cells, each memory cell located at an intersection of a bit line and a word line;

wherein at least one memory cell comprises:

a gate stack overlying a silicon substrate;

a first source/drain region and a second source/drain region in the silicon substrate on opposing sides of the gate stack;

a capacitor having a bottom plate, a top plate and a dielectric layer interposed between the bottom plate and the top plate, wherein the bottom plate contains tungsten;

an unsaturated titanium nitride layer adjoining a silicon-containing material, wherein the silicon-containing material is selected from the group consisting of the first source/drain region and a silicon-containing contact plug adjoining the first source/drain region;

a titanium silicide layer formed at an interface between the unsaturated titanium nitride layer and the silicon-containing material; and a tungsten nitride layer overlying the unsaturated titanium nitride layer, wherein the tungsten nitride layer is coupled to the bottom plate of the capacitor and wherein the tungsten nitride layer has a lower affinity for nitrogen than the unsaturated titanium nitride layer.

* * * * *

UNITED STATES PATENT AND TRADEMARK OFFICE
CERTIFICATE OF CORRECTION

PATENT NO. : 6,688,584 B2　　　　　　　　　　　　　　　　　　　　　　Page 1 of 1
APPLICATION NO. : 09/858617
DATED : February 10, 2004
INVENTOR(S) : Ravi Iyer et al.

It is certified that error appears in the above-identified patent and that said Letters Patent is hereby corrected as shown below:

Column 19,
Line 49, replace "suicide" with --silicide--

Column 19,
Line 51, replace "suicide" with --silicide--

Column 23,
Line 23, replace "suicide" with --silicide--

Column 23,
Line 42, replace "suicide" with --silicide--

Signed and Sealed this

Twenty-first Day of November, 2006

JON W. DUDAS
*Director of the United States Patent and Trademark Office*